(12) United States Patent
Witschnig et al.

(10) Patent No.: US 8,283,975 B2
(45) Date of Patent: Oct. 9, 2012

(54) DATA PROCESSING SYSTEM

(75) Inventors: Harald Witschnig, Gratkorn (AT); Franz Amtmann, Graz (AT); Christian Patauner, Frangart (IT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/921,596

(22) PCT Filed: Mar. 9, 2009

(86) PCT No.: PCT/IB2009/050977
§ 371 (c)(1),
(2), (4) Date: Dec. 7, 2010

(87) PCT Pub. No.: WO2009/113014
PCT Pub. Date: Sep. 17, 2009

(65) Prior Publication Data
US 2011/0102078 A1 May 5, 2011

(30) Foreign Application Priority Data
Mar. 10, 2008 (EP) .................................... 08102447

(51) Int. Cl.
*H04L 27/22* (2006.01)

(52) U.S. Cl. ............... 329/304; 340/10.1; 340/12.11; 455/146; 455/73

(58) Field of Classification Search .............. 329/304, 329/306, 308; 455/73, 146; 340/10.1, 12.11
See application file for complete search history.

(56) References Cited

U.S. PATENT DOCUMENTS

| | | |
|---|---|---|
| 4,416,016 A | 11/1983 | Iapicco |
| 4,769,816 A | 9/1988 | Hochstadt et al. |
| 4,835,792 A * | 5/1989 | Davarian .................. 375/324 |
| 5,448,594 A | 9/1995 | Huang et al. |

FOREIGN PATENT DOCUMENTS

| | | |
|---|---|---|
| JP | 61-073459 A | 4/1986 |
| WO | 86/00186 A1 | 1/1986 |

* cited by examiner

*Primary Examiner* — Arnold Kinkead

(57) ABSTRACT

A device (100) for processing an input signal (102), the device (100) comprising a delay unit (104) adapted for delaying the input signal (102) by a predefined delay time, at least one phase shifting unit (106) each adapted for phase shifting the delayed input signal (108) by an assigned phase value, a plurality of mixer units (110) each adapted for mixing the input signal (102) with the delayed input signal (108) or with one of the at least one phase shifted signal (112), and an extraction unit (114) adapted for extracting information from each of the mixed signals (116).

19 Claims, 2 Drawing Sheets

DATA PROCESSING SYSTEM

FIELD OF THE INVENTION

The invention relates to a device for processing an input signal.

The invention further relates to a method of processing an input signal.

Moreover, the invention relates to a program element.

Furthermore, the invention relates to a computer-readable medium.

BACKGROUND OF THE INVENTION

The importance of automatic identification systems increases particularly in the service sector, in the field of logistics, in the field of commerce and in the field of industrial production. Further applications of identification systems are related to the identification of persons and animals.

In particular contactless identification systems like transponder systems (for instance using an RFID tag) are suitable for a wireless transmission of data in a fast manner and without cable connections that may be disturbing. Such systems use the emission and/or absorption of electromagnetic waves, particularly in the high frequency domain (for instance at frequencies of 800 MHz to 900 MHz). Alternatively, such systems may be based on a magnetic coupling (for instance at a frequency of 13.56 MHz).

Such and other systems may use a phase modulated signal of a 13.56 MHz carrier from a reader to a card. Therefore, it is of significance to provide a proper corresponding receiver structure on the label side.

Phase demodulators itself are well known but have to be adapted for specific needs. The need of very high data rates (several Mbit/s) based on a 13.56 MHz carrier may make it necessary to use higher order modulation schemes, and therefore new receiver structures may be necessary as the actual concepts will not be able to handle the needs.

Additionally it is to mention that the receiver structure should be implemented on the card side and therefore the technical effort has to be as low as possible.

FIG. 5 schematically shows a conventional demodulation circuit 500 in which a received signal (phase modulated) 502 is coupled to a mixer 504 for mixing the signal 502 with cos(phi). The mixed signal 506 is supplied to a matched filter unit 508 filtering the signal 506 to generate a signal 510 which is then supplied to a threshold detector 512.

The phase modulated signal 502 received via an antenna can thus be mixed by means of the mixer or multiplier 504 with cos(phi). The received signal 506 is filtered by the filter unit 508. The threshold detector 512 serves for assigning the voltage levels of the, for instance, step-shaped voltage characteristic to different logical states, to thereby reconstruct the information included in the radio signal 502.

However, the demodulator circuit 500 shown in FIG. 5 requires a relatively large space on an integrated circuit and consumes a lot of energy during operation. Furthermore, it may be difficult to detect PSK modulated signals, regarding current and area.

OBJECT AND SUMMARY OF THE INVENTION

It is an object of the invention to enable data processing with reasonable effort.

In order to achieve the object defined above, a device for processing an input signal, a method of processing an input signal, a program element and a computer readable medium according to the independent claims are provided.

According to an exemplary embodiment of the invention, a device for processing an input signal is provided, the device comprising a delay unit (which may be a component where a signal input to the delay unit reaches the output of the component after a known period of time has elapsed) adapted for delaying the input signal by a predefined delay time (for instance by one symbol), at least one phase shifting unit each adapted for phase shifting the delayed input signal by an assigned phase value (for instance a plurality of phase shifting units may be provided each adapted for phase shifting the delayed input signal by an assigned phase value, wherein the phase values assigned to different phase shifting units may be different), a plurality of mixer units (such as multiplier units; alternatively it is also possible to mix by sampling the signal, particularly to derive the base signal and to eliminate the carrier signal) each adapted for mixing the input signal with the delayed input signal or with one of the at least one phase shifted signal (for example, one of the mixer units may mix the input signal with the delayed signal for correlation purposes, and one or more remaining mixer units may mix the input signal with a signal output of a dedicated one of the one or more phase shift units for correlation purposes), and an extraction unit adapted for extracting information (particularly digital information) from each of the mixed signals (for instance deriving a logical value encoded in the mixed signals by filtering and threshold comparison analysis; particularly, this may include deriving or reconstructing the information or use data included in the input signal which may be the result of the capturing of electromagnetic radiation by an antenna).

According to another exemplary embodiment of the invention, a method of processing an input signal is provided, the method comprising delaying the input signal by a predefined delay time, phase shifting the delayed input signal by an assigned phase value, mixing the input signal with the delayed input signal, mixing the input signal with the phase shifted signal (for instance sequentially or simultaneously with the mixing of the input signal with the delayed input signal), and extracting information from each of the mixed signals.

According to yet another exemplary embodiment of the invention, a computer-readable medium (for instance an EEPROM, a CD, a DVD, a USB stick, a floppy disk or a harddisk) is provided, in which a computer program of data processing is stored which, when being executed by a processor, is adapted to control or carry out a method having the above mentioned features.

According to still another exemplary embodiment of the invention, a program element (for instance a software routine, in source code or in executable code) of data processing is provided, which program element, when being executed by a processor, is adapted to control or carry out a method having the above mentioned features.

Data processing which may be performed according to embodiments of the invention can be realized by a computer program, that is by software, or by using one or more special electronic optimization circuits, that is in hardware, or in hybrid form, that is by means of software components and hardware components.

According to an exemplary embodiment of the invention, a receiver structure for demodulating differential phase modulated signals may be provided. Such a system may be implemented in different technical fields but may be specifically advantageous for RFID (Radio Frequency Identification) and NFC (Near Field Communication) applications. Differentially phase modulated signals may have the advantage that the carrier wave on the receiver side does not have to be reconstructed.

According to an exemplary embodiment of the invention, the received signal can be mixed (for instance using several mixers and/or multipliers) individually with several signals delayed by one symbol and a part thereof being individually phase shifted. A symbol may represent a data section of one or more bits assembled to form one state (in a representation in an IQ diagram). According to an exemplary embodiment, multiple phase states in a data section may be interpreted as multiple bits. For instance, a phase state of 45° may be interpreted as a logical value "111". By delaying the signal by one symbol, the mixer may mix two signals differing by one symbol (more precisely, a part of the mixers may mix two signals differing by one symbol and a phase shift), to thereby form the basis for a subsequent recovery of phase information from a correspondingly correlated signal. The received signals may be supplied to parallel connected filters (for instance low-pass filters) and comparators. At an output of the respective comparators, logical or digital values are then included in each of a plurality of analysis channels which, in combination, allow a simple reconstruction of the content of the received signal.

Such an architecture allows to provide a circuit (for instance an integrated circuit or a conventionally wired circuit, or a pure software solution) which has a very simple design. Exemplary embodiments of the invention may further consume much less silicon area and energy during operation as compared to conventional demodulator circuits. Thus, such an architecture is specifically suitable for RFID and NFC applications with high data rates.

According to an exemplary embodiment of the invention, a device for demodulating a differential phase modulated input signal is provided, comprising a delay stage which delays said input signal by one symbol, N phase shifters having said clock signal as input signal and providing N phase shifted clock signals, N mixers for mixing said input signal with said N phase shifted clock signals, and N filter stages and N downstream comparators for assigning a logical state to said mixed signals, wherein N is a natural number greater than one.

Systems according to exemplary embodiments of the invention may use a phase modulated signal (for instance of a 13.56 MHz carrier) from a reader to a card, or from a card to a reader.

According to an exemplary embodiment of the invention, a device for re-extracting of information of a modulated signal is provided, wherein several coupled phase states or phase positions can be determined which represent the encoded information. When evaluating a differential signal in a receiver, a signal differentially phase modulated in a sender may be analyzed or processed to determine phase jumps generated in the sender.

According to an exemplary embodiment of the invention, a cascaded receiver structure for differential-phase modulated signals is provided, particularly in the 13.56 MHz signal domain. Applications of RFID systems (in particular Near Field Communication Systems, NFC) make high transmission rates necessary as conventionally achievable transmission rates are comparably low. An example of such an application is an electronic passport where pictures, fingerprints and other biometric data have to be transferred with the shortest time possible.

According to an exemplary embodiment of the invention, a transmission concept strategy is provided enabling these high transmission rates. The disclosed concept does not require to make use of absolute phase modulated signals but may be based on differential phase modulated signals. An advantage of this is that no carrier recovery at the receiver is necessary, thereby simplifying the card receiver structure. A further difference to conventional phase demodulation concepts it that there is no need of a PLL (phase locked loop) for carrier recovery, and that a cascaded structure may be used to detect an M-PSK modulated signal (M>1).

Next, further exemplary embodiments of the device will be explained. However, these embodiments also apply to the method, to the program element and to the computer-readable medium.

The device may be adapted for demodulating a differential phase modulated input signal. Such a signal may have the advantage, that it is not necessary on the receiver side to reconstruct the carrier wave. Phase modulation may be denoted as a form of modulation that represents information as variations in the instantaneous phase of a carrier wave.

The extraction unit may comprise a filter unit adapted for filtering the mixed signals. Such a filtering may remove artifacts from the signals and therefore allow to increase the accuracy of the demodulation procedure. Such a filter unit may be a low pass filter unit, in order to remove undesired high frequency contributions. A low pass filter may be denoted as a filter that passes all frequencies below its cut-off frequency and rejects those above the cut-off. In accordance with the mixer performance in which the mixer mixes two signals having the same frequency, an output of the mixer (for instance a multiplier) may comprise a component of the double frequency. The filter may have the capability of removing or suppressing such a double frequency.

The extraction unit may further comprise a comparator unit adapted for comparing the filtered mixed signals with a threshold value to extract a logical value for each of the filtered mixed signals. Such a logical value may be a logical value "1" or a logical value "0". The comparator unit may be formed as a single comparator member having, in addition to an input at which a reference signal is provided, a plurality of use signal inputs, or may be formed as a plurality of separate comparator members each having, in addition to an input at which a reference signal is provided, one or more use signal inputs. In other words, instead of using a number M of comparators, it is possible to use only one comparator with M inputs, or another set in between.

The device may comprise a plurality of parallel signal processing paths. This may allow for a fast parallel processing, since different signals can be evaluated parallel in time. A cascade of several circuit paths which are connected in parallel to one another may be each provided with a serial arrangement of mixer unit, filter unit and comparator unit. The parallel signal processing enabled with such an architecture may result in a fast and accurate signal evaluation.

The device may comprise a plurality of phase shifting units having assigned phase values which are equally distributed. The term "equally distributed" may particularly denote that the distance between phase shifts of subsequent phase shifting units have a constant value. For example, this may be achieved by phase shifting units which shift the signal by 90°, 180°, and 270°. Alternatively, this may be achieved by phase shifting units which shift the signal by 45°, 135°, 225° and 315°. Many other combinations are, of course, possible.

The device may comprise a multiplexer unit adapted for multiplexing signals output by the extraction unit. Thus, such a multiplexer may generate a data stream based on the output signals of the comparators. A multiplexer may be denoted as a device that selects one of many data sources at a time and outputs that source into a single channel.

The term "transponder" may particularly denote an RFID tag or a contactless chip card. More generally, a transponder may be a device (for instance comprising a chip) which may automatically transmit certain (for example coded) data when activated by a special signal from an interrogator. The transponder may be a (for instance contactless) smartcard.

An RFID tag may comprise a semiconductor chip (having an integrated circuit) in which data may be programmed or rewritten, and a high frequency antenna matched to an operation frequency band used (for example 13.56 MHz). Besides the RFID tag, an RFID system may comprise a read/write device (i.e. a base station) and a system antenna enabling a bidirectional wireless data communication between the RFID tag and the read/write device. Use of a dipole antenna is possible. Additionally, an input/output device (for instance a computer) may be used to control the read/write device. Different types of RFID systems are distinguished, namely active RFID systems (supply by a battery) and passive RFID systems (supplied with energy via the RF field). Moreover, semi-active (semi-passive) systems which are passively activated and in which a battery is used on demand (for instance for transmitting data) are available. Also polymer tags can be used, according to an exemplary embodiment of the invention.

A smartcard or chip card can be a tiny secure crypto processor embedded within a credit card-sized card or within an even smaller card. A smartcard does usually not contain a battery, but power is supplied by a card reader/writer, that is to say by a read and/or write device for controlling the functionality of the smartcard by reading data from the smartcard or by writing data in the smartcard. A smartcard device may particularly be used in the areas of finance, security access and transportation. Such smartcards may contain high security processors that function as a security storage of data like card holder data (for instance name, account numbers, a number of collected loyalty points).

The device (for instance an RFID tag) may be free of any oscillating crystal generating a frequency. Thus, the device may be manufactured in a very small dimension. Thus, no oscillator has to be used for clock generation, but in contrast to this, energy and clock are derived from the generating field.

The device may be adapted as a receiver device (such as an RFID tag) to be communicatively coupled to a sender device (such as a base station). In the sender device, a signal may be modulated (for instance in a conventional manner) and transmitted to the receiver device for demodulation, as described herein.

Exemplary fields of application of embodiments of the invention relate to eGovernment public services, for instance National ID, health cards, driving licenses, etc. Applications like digital signature, log on, secure transactions are further fields of application.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
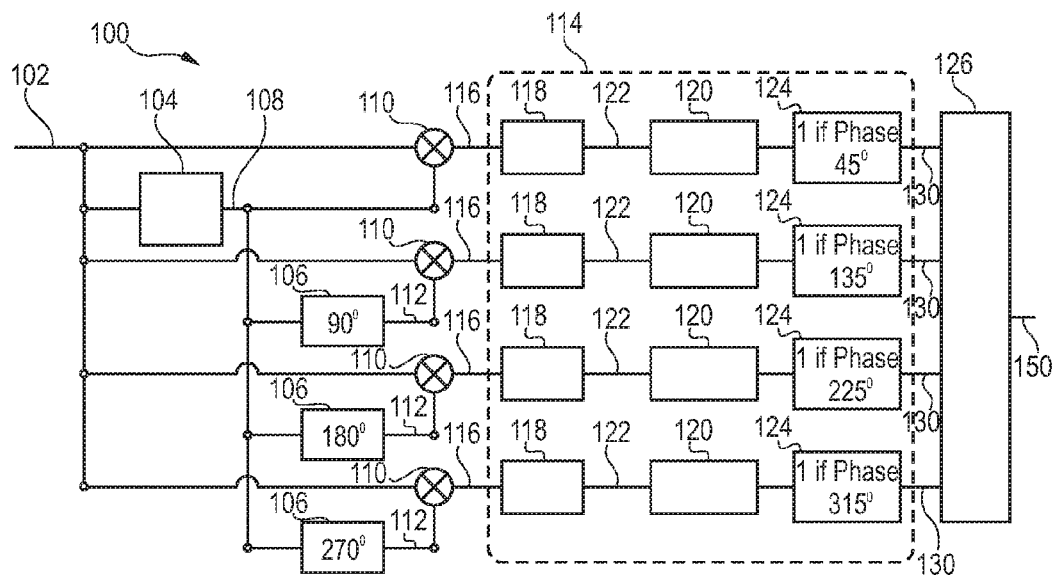
FIG. 1 illustrates a demodulator circuit according to an exemplary embodiment of the invention.

The illustration in the drawing is schematical. In different drawings, similar or identical elements are provided with the same reference signs.

FIG. 1 illustrates a demodulator circuit 100 according to an exemplary embodiment of the invention.

The demodulator circuit 100 is adapted for demodulating a differential phase modulated input signal 102.

The input signal 102 is supplied to an input of a delay unit 104 for delaying the input signal 102 by a predefined delay time, particularly by one symbol.

A delayed signal 108 output by the delay unit 104 is supplied directly to a mixer unit 110 of a most upper signal processing path of the circuit 100 of FIG. 1. In parallel, the delayed signal 108 output by the delay unit 104 is supplied to a first phase shifting unit 106 shifting the signal 108 by a phase of 90°. The delayed signal 108 is further supplied to another phase shifting unit 106 performing a phase shift of 180°. Moreover, the delayed signal 108 is supplied to a further phase shifting unit 106 shifting the phase of the signal 108 by 270°. An output signal 112 of each of the phase shifting units 106 is supplied to a corresponding one of further mixer units 110 in three further signal paths, as can be taken from FIG. 1.

Each of the mixer units 110 mixes the input signal 102 with the respective signal at another input of the respective mixer unit 110, namely the delayed signal 108 in case of the most upper mixer unit 110, and the respective phase shifted signal 112 for the other signal paths.

Mixed signals 116 of each signal path provided at outputs of the mixer units 110 are then supplied to an extraction unit 114 which is adapted for extracting information from each of the mixed signals 116.

The extraction unit 114 comprises, in each of the four parallel signal paths, a respective low pass filter 118 for low pass filtering the signal 116 to derive a filtered signal 122. The filtered signal 122 is then supplied to a comparator unit 120 which is provided as well in each of the signal paths of FIG. 1. The comparator unit 120 compares the filtered mixed signal 122 with a reference value to extract a logical value for each of the filtered mixed signals 122 in accordance with a logic which is schematically indicated by reference numeral 124.

A multiplexer unit 126 is supplied with the signals 130 output by the extraction unit 114 to multiplex the signals 130. Thus, at a global output 150 of the demodulator circuit 100, a signal indicative of the content of the differential phase modulated input signal 102 is provided.

The demodulator circuit 100 relates to a receiver structure of an RFID tag which allows to detect a 4-PSK. However, other embodiments of the invention may be implemented with any other M-PSK, wherein M is a natural number larger than one.

Still referring to FIG. 1, the first comparator 120 provides a logical value "1" only when the phase position is 45° of the input signal 102 (see also the output signal 460 of the comparator in FIG. 4), otherwise the first comparator 120 provides a logical value "0". Thus, in the embodiment of FIG. 1, four parallel data streams are received which can be combined by the multiplexer 126. The demodulator circuit 100 of FIG. 1 can be extended to any desired value of stages.

Figure 2:
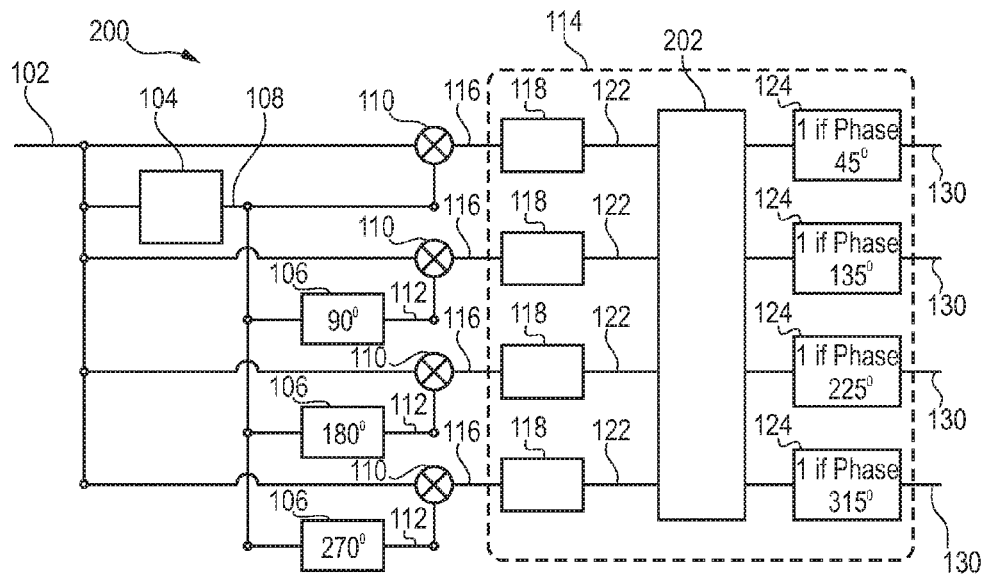
FIG. 2 illustrates a demodulator circuit according to another exemplary embodiment of the invention.

A demodulator device 200 according to another exemplary embodiment of the invention which is shown in FIG. 2 differs from the embodiment of FIG. 1 particularly in that no multiplexer 126 is provided so that individual data signals 130 are provided at the output of the demodulator circuit 200. Furthermore, instead of providing an individual comparator unit 120 for each of the parallel signal processing paths of FIG. 1, the embodiment of FIG. 2 uses a single comparator member 202 having four use signal inputs.

Figure 3:
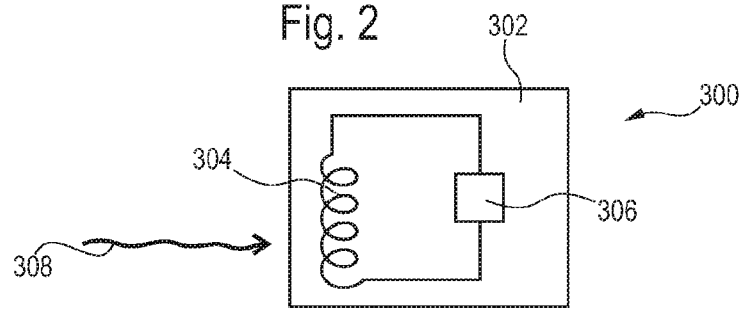
FIG. 3 illustrates an RFID tag according to an exemplary embodiment of the invention.

FIG. 3 illustrates an RFID tag 300 according to an exemplary embodiment of the invention.

The RFID tag 300 comprises a substrate 302 such as a fabric or a plastic label. On the substrate 302, an integrated circuit 306 (such as an electronic chip, for instance a silicon chip) is mounted which may be formed in silicon technology. The integrated circuit 306 includes, inter alia, a demodulator circuit 100. Furthermore, the integrated circuit 306 may include further electronic components, such as a rectifier, a modulator, a memory, an encryptor, a decryptor, etc.

An antenna coil 304 is coupled with the integrated circuit 306. The antenna 304 is adapted for receiving an electromagnetic wave 308 generated by a reader/writer device (not shown). For interpreting a signal included in the electromagnetic wave 308, the demodulator circuit 100 of the integrated circuit 306 may demodulate the received signal.

Figure 4:
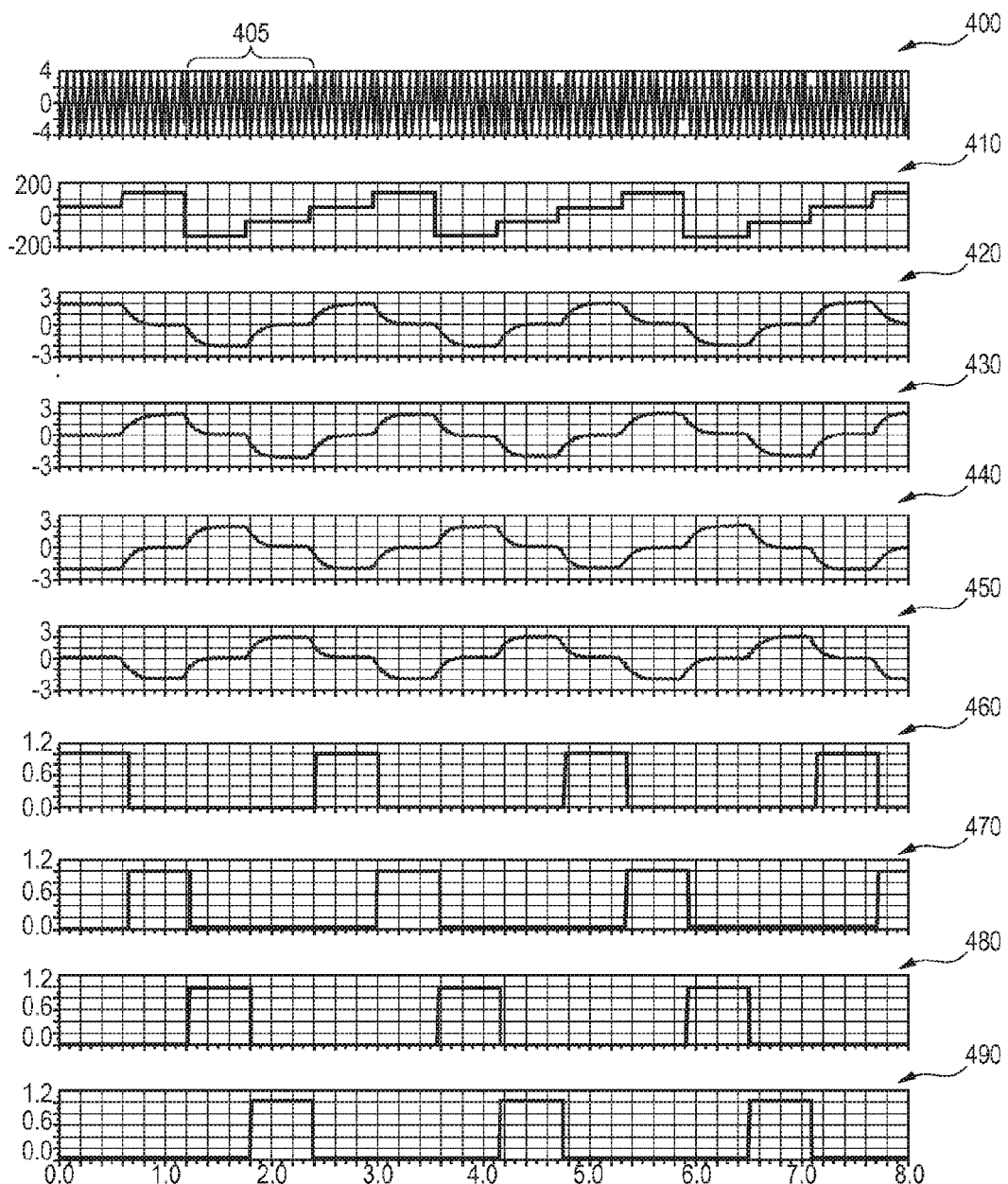
FIG. 4 shows signal forms obtainable with a demodulator circuit according to an exemplary embodiment of the invention.
Figure 5:
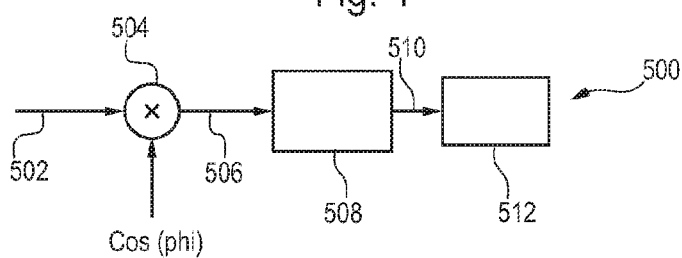
FIG. 5 illustrates a conventional demodulator.

FIG. 4 shows diagrams illustrating various signals occurring in the demodulator circuit 100. Each of the diagrams of FIG. 4 has an abscissa (horizontally aligned) along which a time is plotted in microseconds. Along ordinates (vertically aligned) of the diagrams of FIG. 4, corresponding signal values are plotted.

Also referring to FIG. 1, a diagram 400 of FIG. 4 shows the time dependence of the differential phase modulated input signal 102. A delay by one symbol (as provided by the delay unit 104) is indicated in diagram 400 by reference numeral 405.

A diagram 410 shows the digital content of the differential phase modulated input signal 102 to be reconstructed by the demodulator circuit 100. In other words, diagram 410 shows a baseband signal representing four different phases.

A diagram 420 shows the signal 116 output by the low-pass filter 118 in the first (most upper) signal processing path of the demodulator circuit 100.

A diagram 430 shows the signal 116 output by the low-pass filter 118 in the second signal processing path of the demodulator circuit 100.

A diagram 440 shows the signal 116 output by the low-pass filter 118 in the third signal processing path of the demodulator circuit 100.

A diagram 450 shows the signal 116 output by the low-pass filter 118 in the fourth (lowest) signal processing path of the demodulator circuit 100.

As can be taken from the diagrams 420, 430, 440, 450 (showing four signal forms before processing by the comparator 120 representing the basis for the detection), the signal content is still smeared out due to overlaid high-frequency components. Since the filter units 118 are not ideal filters, it may happen that a small contribution of a high frequency distribution is still present on the signals shown in diagrams 420, 430, 440, and 450.

A diagram 460 shows the signal 130 output downstream the comparator unit 120 in the first (most upper) signal processing path of the demodulator circuit 100.

A diagram 470 shows the signal 130 output downstream the comparator unit 120 in the second signal processing path of the demodulator circuit 100.

A diagram 480 shows the signal 130 output downstream the comparator unit 120 in the third signal processing path of the demodulator circuit 100.

A diagram 490 shows the signal 130 output downstream the comparator unit 120 in the fourth (lowest) signal processing path of the demodulator circuit 100.

As can be taken from FIG. 4, the signal content 410 can be reconstructed based on the comparator outputs shown in diagrams 460, 470, 480, 490.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A device for processing an input signal, the device comprising:
    a delay unit adapted for delaying the input signal by a predefined delay time;
    a plurality of phase shifting units each adapted for phase shifting the delayed input signal by an assigned phase value, wherein the assigned phase values are equally distributed;
    a plurality of mixer units one of which being adapted for mixing the input signal with the delayed input signal and at least another one of which being adapted for mixing the input signal with one of the phase shifted signals; and
    an extraction unit adapted for extracting information from each of the mixed signals.

2. The device according to claim 1, wherein the device is adapted for demodulating a differential phase modulated input signal.

3. The device according to claim 1, wherein the extraction unit comprises a filter unit adapted for filtering the mixed signals.

4. The device according to claim 3, wherein the extraction unit comprises a comparator unit adapted for comparing the filtered mixed signals with a threshold value to extract a logical value for each of the filtered mixed signals.

5. The device according to claim 3, wherein the filter unit is a low pass filter unit.

6. The device according to claim 1, comprising a plurality of parallel signal processing paths.

7. The device according to claim 1, comprising a multiplexer unit adapted for multiplexing signals output by the extraction unit.

8. The device according to claim 1, adapted as one of the group consisting of a transponder, a Radio Frequency Identification tag, a Near Field Communication unit, and a contactless chip card.

9. The device according to claim 1, adapted as a receiver device to be communicatively coupled to a sender device.

10. The device according to claim 1, being free of any oscillating crystal generating a frequency.

11. A method of processing an input signal, the method comprising:
    delaying the input signal by a predefined delay time;
    phase shifting the delayed input signal by a plurality of equally distributed phase values to generate a corresponding plurality of phase shifted signals;
    mixing the input signal with the delayed input signal;
    mixing the input signal with each of the phase shifted signals; and extracting information from each of the mixed signals.

12. A non transitory computer readable storage medium, in which a computer program of processing an input signal is stored, which computer program, when being executed by a processor, is adapted to carry out or control the method according to claim 11.

13. A device for processing an input signal, the device comprising:
- a delay unit adapted for delaying the input signal by a predefined delay time;
- at least one phase shifting unit each adapted for phase shifting the delayed input signal by an assigned phase value;
- a plurality of mixer units one of which being adapted for mixing the input signal with the delayed input signal and at least another one of which being adapted for mixing the input signal with one of the at least one phase shifted signal;
- an extraction unit adapted for extracting information from each of the mixed signals; and
- a multiplexer unit adapted for multiplexing signals output by the extraction unit.

14. The device according to claim 1, wherein the device is adapted for demodulating a differential phase modulated input signal.

15. The device according to claim 1, wherein the extraction unit comprises a filter unit adapted for filtering the mixed signals.

16. The device according to claim 3, wherein the extraction unit comprises a comparator unit adapted for comparing the filtered mixed signals with a threshold value to extract a logical value for each of the filtered mixed signals.

17. The device according to claim 3, wherein the filter unit is a low pass filter unit.

18. The device according to claim 1, adapted as one of the group consisting of a transponder, a Radio Frequency Identification tag, a Near Field Communication unit, and a contactless chip card.

19. The device according to claim 1, adapted as a receiver device to be communicatively coupled to a sender device.

* * * * *